United States Patent [19]

Yasuda

[11] 4,306,309
[45] Dec. 15, 1981

[54] MEMORY CONTROL CIRCUIT FOR A TELEVISION RECEIVER

[75] Inventor: Hiroshi Yasuda, Kanagawa, Japan

[73] Assignee: Sony Corporation, Tokyo, Japan

[21] Appl. No.: 116,485

[22] Filed: Jan. 29, 1980

[30] Foreign Application Priority Data

Feb. 1, 1979 [JP] Japan .................................. 54/11099

[51] Int. Cl.³ .............................................. H04B 1/16
[52] U.S. Cl. .................................... 455/183; 455/184; 455/186
[58] Field of Search ................ 455/161, 166, 183–186, 455/165; 358/195.1

[56] References Cited

U.S. PATENT DOCUMENTS

| | | | |
|---|---|---|---|
| 3,965,336 | 6/1976 | Grohmann | 455/166 |
| 4,123,724 | 10/1978 | Das et al. | 455/185 |
| 4,138,647 | 2/1979 | Wine | 455/186 |
| 4,209,751 | 6/1980 | Sakamoto | 455/186 |
| 4,236,251 | 11/1980 | Ohgishi et al. | 455/180 |

Primary Examiner—Jin F. Ng
Attorney, Agent, or Firm—Lewis H. Eslinger; Alvin Sinderbrand

[57] ABSTRACT

In an electronic radio frequency tuner of the type having a source of digital signals representing radio frequencies to which the tuner is tuned and an addressable memory, a memory control circuit includes an addressing circuit having an operative state for selectively providing address-identifying signals which select respective addresses of the memory, a write-in control circuit for writing a digital signal into a selected address of the memory, a further memory for selectively memorizing one of the digital signals from the source and one of the address-identifying signals from the addressing circuit, and a switching circuit for selectively supplying one of the digital signals or one of the address-identifying signals to the further memory in accordance with the state of the addressing circuit.

11 Claims, 6 Drawing Figures

1

MEMORY CONTROL CIRCUIT FOR A TELEVISION RECEIVER

BACKGROUND OF THE INVENTION

1. Field of the Invention

The present invention relates generally to a memory control circuit for use with an addressable memory, and is directed more particularly to a memory control circuit for an addressable memory of a frequency synthesizer tuner.

2. Description of the Prior Art

In the prior art, an addressable memory of a nonvolatile type is used as a preset memory of a frequency synthesizer tuner to memorize or store desired frequencies in the form of digital codes.

It is also known to provide, in addition to the above memory, a so-called last station memory, which memorizes or stores the digital code corresponding to the broadcast frequency received immediately before the power source or switch of the tuner is turned OFF, and then to read the stored digital code and receive the same broadcast frequency when the power source of the tuner is turned ON again.

With the above prior art arrangement, when the code identifying the address in the preset memory and the code corresponding to the received frequency are both memorized in the last station memory, the latter memory requires a large number of bits of capacity and hence is relatively expensive.

OBJECTS AND SUMMARY OF THE INVENTION

Accordingly, an object of the present invention is to provide a memory control circuit for use with an addressable memory and which is free of the described defects of the prior art.

Another object of the invention is to provide a memory control circuit for use with an addressable memory by which the address-identifying code of a preset memory or a received frequency code are selectively memorized in a last station memory.

In accordance with an embodiment of the invention, an electronic radio frequency tuner of the type having a source of digital signals representing radio frequencies to which the tuner is tuned and an addressable memory is provided with a memory control circuit which includes an addressing circuit having an operative state for selectively providing address-identifying signals which select respective addresses of the memory, a write-in control circuit for writing a digital signal into the selected address of the memory, a further memory for selectively memorizing one of the digital signals from the source and one of the address-identifying signals from the addressing circuit, and a switching circuit for selectively supplying one of the digital signals or one of the address-identifying signals to the further memory in accordance with the state of the addressing circuit.

The above, and other objects, features and advantages of the present invention will become apparent from the following detailed description of preferred embodiments when read in conjunction with the accompanying drawings, in which like reference numerals designate corresponding elements.

DESCRIPTION OF THE PREFERRED EMBODIMENTS

Figure 1:
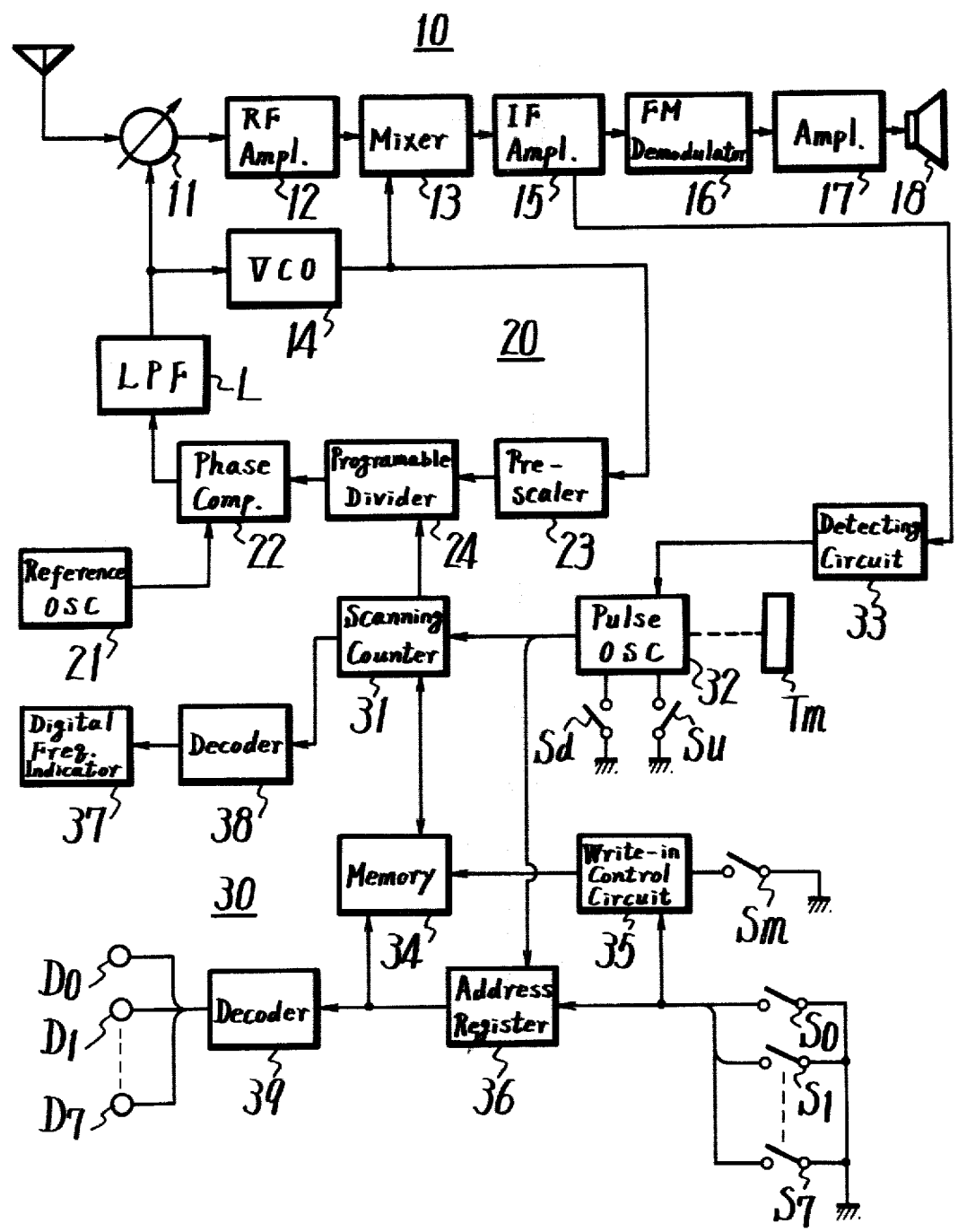
FIG. 1 is a circuit block diagram of a frequency synthesizer tuner of a type in which a memory control circuit according to the present invention may be advantageously applied.

Referring in detail to FIG. 1, it will be seen that a receiver or tuner 10, to which the present invention may be advantageously applied, includes an RF (radio frequency) tuning circuit 11, an RF amplifier 12, a mixer 13, a VCO (voltage controlled local oscillator) circuit 14, an IF (intermediate frequency) amplifier 15, an FM demodulator circuit 16, an LF (low frequency) amplifier 17 and a speaker 18.

A PLL (phase locked loop) circuit 20 is shown in FIG. 1 to include a reference signal oscillator circuit 21, which generates a reference signal with the frequency of, for example, 5 KHz which is fed to a phase comparator circuit 22. The oscillation signal from the VCO circuit 14 is fed to a pre-scaler 23 which frequency-divides the signal by, for example, 20. The frequency-divided signal is fed from pre-scaler 23 to a programmable divider 24 and frequency-divided therein by N, the dividing ratio determined by a tuning control circuit 30. The frequency-divided signal from divider 24 is supplied to the phase comparator circuit 22 whose output is supplied through a low pass filter L to the tuning circuit 11 and VCO circuit 14, for example at its variable capacitance diodes (not shown).

Thus, when PLL 20 is in equilibrium or in its stable state, the frequency of the output from the programmable divider 24 is 5 KHz which is the same as the frequency of the reference signal from the reference oscillator circuit 21, so that in this state the oscillation frequency of the VCO circuit 14 is N×20×5 KHz. In this state, for example, a broadcast frequency of (N×100+10700) KHz is converted into the IF signal with the frequency of 10.7 MHz. Thus, broadcast frequencies within the band of 76 to 90 MHz can be received in 100 KHz increments by varying the frequency-dividing ratio N of divider 24 from 653 to 793.

In FIG. 1, a tuning control circuit 30 sets the dividing ratio N of divider 24 for tuning to a desired broadcast frequency. More particularly, a scanning counter (data register) 31 is provided which up- or down-counts scanning pulses to control the dividing ratio N. Whenever the count value N of the scanning counter 31 is changed, the value N is transferred to the divider 24 to control its dividing ratio N. A pulse oscillator circuit 32 is provided which produces the scanning pulses. A manual tuning knob Tm is ganged with the pulse oscillator circuit 32 to which up and down scanning switches Su and Sd are also connected. When the knob Tm or either scanning switch Su or Sd is operated, the scanning pulses are generated from the oscillator circuit 32 and the count value of the counter 31 is increased or decreased accordingly.

In FIG. 1, a detecting circuit 33 for a received signal rectifies and shapes the IF signal from the IF amplifier 15 to detect whether or not a broadcast signal is being received. A non-volatile memory 34 has the capacity, say, of 12×8 bits, which is sufficient to memorize the frequency data of, in this example, eight stations. The circuit arrangement of FIG. 1 is completed by a write-in control circuit 35, an address register 36, a digital frequency indicator 37 which indicates the received frequency, a decoder 38 which decodes the output of counter 31 for operating indicator 37 therefrom, a decoder 39 for the output of address register 36, display elements $D_0$–$D_7$ operable by decoder 39 for displaying the received channel, a memory switch $S_m$, and channel preset switches $S_0$–$S_7$.

With the tuner shown in FIG. 1, when the knob Tm is rotated, a manual tuning process can be carried out similar to that in an ordinary receiver. That is, when the knob Tm is rotated, beyond a predetermined angle $\theta$, the pulse oscillator circuit 32 produces one scanning pulse, and this pulse is fed to the counter 31 as an input. For example, when the knob Tm is rotated in the clockwise direction, the scanning pulse delivered from the oscillator circuit 32 places the counter 31 in the up-count mode; and when the knob Tm is rotated in the counter-clockwise direction the scanning pulse from the oscillator circuit 32 places the counter 31 in the down-count mode.

The scanning pulses are counted by the counter 31, and the content N, representing the total number of pulses counted by counter 31, is transferred to programmable divider 24, whose frequency-dividing ratio then becomes N. Thus, for each $\theta$ degrees of rotation of the knob Tm, the receiving frequency is changed by 100 KHz for achieving manual tuning. The content of counter 31 is continually transferred through decoder 38 to digital frequency indicator 27, which displays the received frequency in corresponding numerals.

Automatic tuning can be accomplished by closing either switch Su or Sd. When switch Su is closed, or turned ON, a scanning pulse with the frequency of, for example, about 10 Hz is produced by the oscillator circuit 32. This scanning pulse is fed to counter 31, placing it in the up-count mode and increasing the pulse count N of the counter 31 by one. Hence, the dividing ratio N of divider 24 is increased by one for increasing the receiving frequency by an increment of 100 KHz. Oscillator 32 continues to produce pulses as long as switch Su remains closed.

When the tuned frequency arrives at a frequency at which a broadcast signal is present, the received signal is detected by detecting circuit 33. The detected signal therefrom is fed to the pulse oscillator circuit 32 to stop its generation of the scanning pulse. Thus, the tuner continues to receive this frequency.

If the switch Su is closed again, the scanning begins again.

When the switch Sd is closed, the counter 31 carries out an analagous down-counting operation and hence the receiving frequency is lowered in steps of 100 KHz. When a desired broadcast frequency is received, the scanning is stopped.

Preset tuning can be achieved by storing in memory the pulse count Ni of any desired broadcast station which transmits the corresponding frequency Fi, as follows: The desired station is tuned in, either manually or automatically. A switch Sj is chosen from among switches $S_0$ to $S_7$ and is closed while, or within a certain time after, memory switch Sm is also closed. Because switches Sm and Sj are closed simultaneously, an address-identifying signal Aj from address register 36 is generated and fed to memory 34, and a write-in pulse is produced by write-in control circuit 35. This write-in pulse is also fed to memory 34 for causing pulse count Ni to be written into memory 34 at address identified by signal Aj, thus presetting the frequency data of the desired broadcast station. Also, when memory 34 is addressed by address register 36, a corresponding display element Dj of the display elements $D_0$ through $D_7$ is lit by the address output from the memory 34.

If, after the above preset operation has been completed, the desired switch Sj is then closed, the location with address Aj in memory 34 is addressed by the output from register 36 and display element Dj is lit by decoder 39. The frequency data Ni written at address Aj is read out and then fed to the counter 31, causing the count value N of the counter 31 to be set as Ni. As a result, the dividing ratio N of the divider 24 also becomes Ni, causing frequency Fi to be received.

In order to record a broadcast wave on a tape recorder or the like, the frequency of the receiver is tuned to a desired broadcast station and then a timer is set. When the set time arrives, the power switch of the receiver is turned ON by the timer and the tape recorder records the desired broadcast.

It is therefore convenient that when the receiver's power switch is turned ON, the broadcast station that was received immediately before the power switch was previously turned OFF can again be received.

In some synthesizer receivers, at every time when a new broadcast station is received data determining its frequency, i.e. count value N are memorized in a second non-volatile memory (which is referred to as a last channel memory). Then, when the power switch is turned ON again, the broadcast station determined by the memorized data is received.

Figure 2:
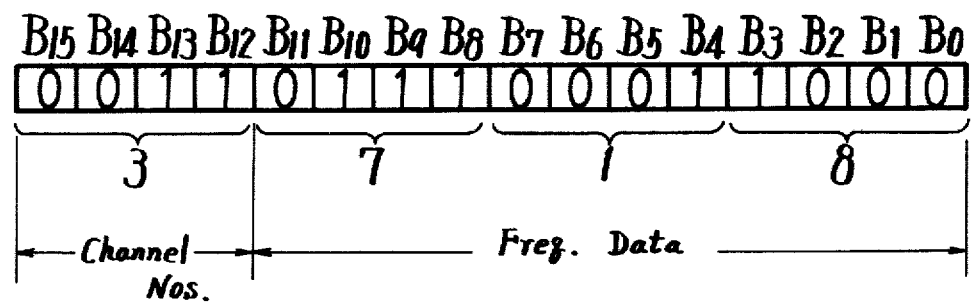
FIG. 2 is a code table showing an example of a digital code that may be supplied to a memory in the tuner of FIG. 1.

This second or last-channel memory is generally a separate non-volatile memory of 16 bits, as shown in FIG. 2, within memory 34. In such a receiver, when a certain broadcast station (for example, having a frequency of 82.5 MHz for which N is 718) is tuned in by either manual tuning or auto tuning, even if the broadcast station has previously been preset in the memory 34, the display elements $D_0$ to $D_7$ are not lit by the output from the memory 34. Rather, the data N=718, representing the frequency 82.5 MHz is provided directly to the programmable divider 24 by counter 31. Accordingly, even if N has been preset in memory 34, the second memory memorizes the frequency data N again, storing the 1's, 10's, and 100's digits of N in BCD code in bits $B_0$ through $B_3$, $B_4$ through $B_7$, and $B_8$ through $B_{11}$, respectively. (See FIG. 2.)

When the same broadcast station (with frequency 82.5 MHz) is selected for reception by means of preset tuning, say from address 3 of memory 34, the corresponding display element $D_3$ is lit and the frequency is displayed on the indicator 37. The register 36 delivers to memory 34 data representing channel 3, and counter 31 delivers to divider 24 frequency data representing the frequency 82.5 MHz. If the last-channel memory were to supply the frequency, however, and only the frequency data were stored in it, the display element $D_3$ could not be lit again if the power switch were turned OFF and then turned ON again, and the user would not know that a preset channel was being received. Therefore, it is necessary that the channel data be memorized in the second memory by utilizing one additional figure of BCD (4 bits), necessitating additional bits $B_{12}$ through $B_{15}$ in the second memory.

Therefore in some receivers the second memory in the memory 34 must be a non-volatile memory of 16 bits. A non-volatile memory with so many bits can be expensive. In view of this problem, the present invention provides a memory control circuit for use with a synthesizer receiver in which a non-volatile memory with fewer bits is employed to make the receiver less expensive.

An embodiment of the present invention will now be described with reference to FIG. 3, in which reference numbers corresponding to those used to identify elements in FIG. 1 designate corresponding elements and parts and the description of such parts will be omitted for the sake of brevity.

Figure 3:
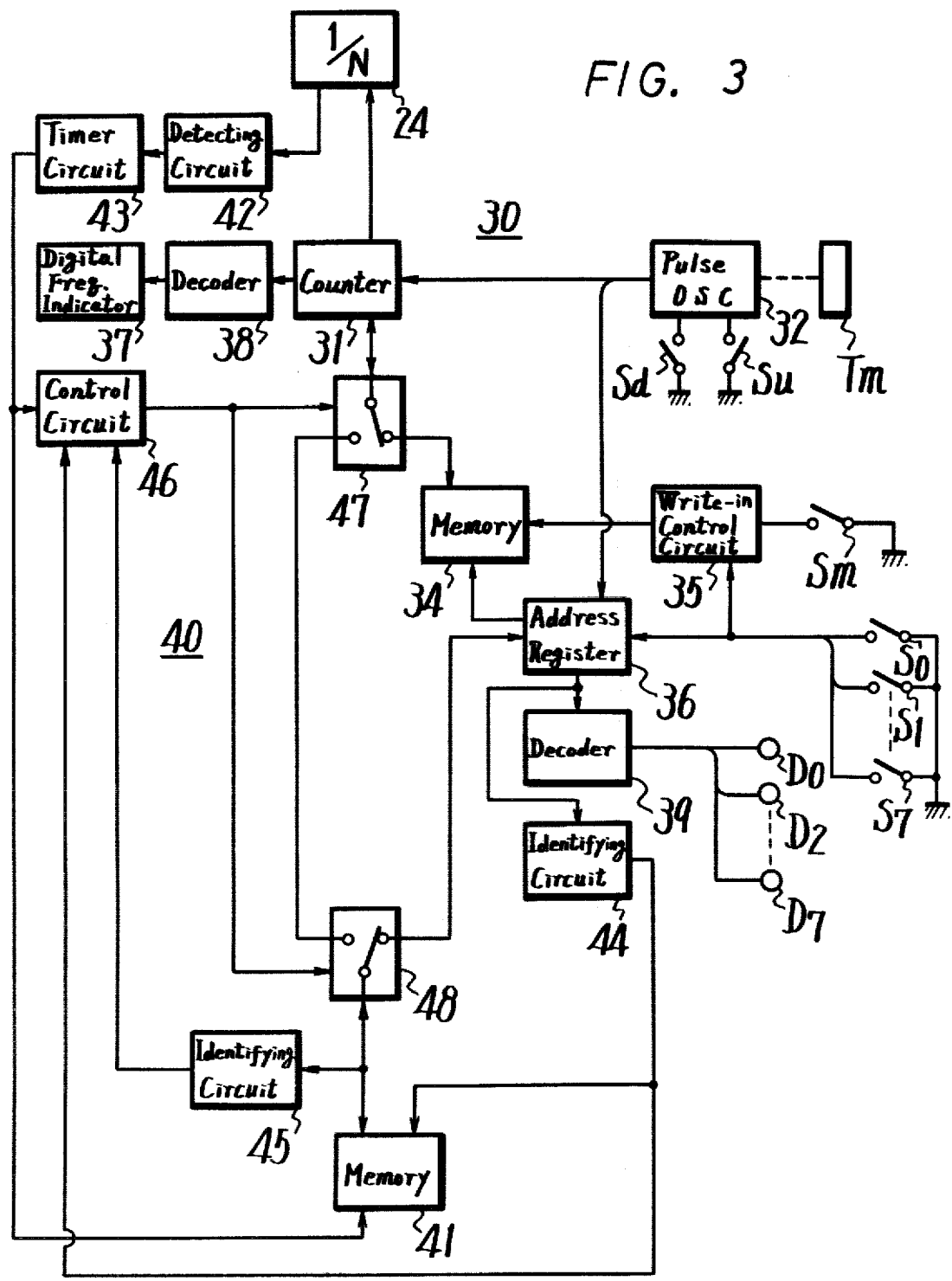
FIG. 3 is a circuit block diagram showing a memory control circuit according to an embodiment of the present invention for use in the tuner of FIG. 1.

In FIG. 3, a memory control circuit for a last-station memory is generally identified by the reference numeral 40. A second non-volatile memory 41 of 12 bits is provided, in addition to and separate from memory 34. Memory 41 serves to store the last broadcast station received when the power switch is turned OFF. A detecting circuit 42 connected to the frequency-divider 24 in the illustrated example, detects when a new receiving frequency is set. That is, the detecting circuit 42 detects the change of the frequency dividing ratio N of the divider 24. A timer circuit 43 is triggered by the output of the detecting circuit 42 and delivers a control pulse after, for example, 4 seconds.

Further, an identifying circuit 44 is provided, which identifies or discriminates whether or not the memory 34 is addressed by the address register 36 and has its output supplied to the second memory 41 as a write-in control signal for the data. A second identifying circuit 45 is provided for identifying whether the most significant bit $B_{11}$ (refer to FIG. 4) of the memory 41 is "1" or "0". The output from circuit 45 is supplied to a control circuit 46. Further, switch circuits 47 and 48 are provided which are normally in the positions shown in FIG. 3.

In the embodiment of the invention shown in FIG. 3, with switch circuits 47 and 48 in their normal positions, as illustrated, manual, automatic, and preset tuning can be carried out exactly as in the receiver shown in FIG. 1.

Storing of a broadcast station in the last-station memory 41 is carried out as follows:

When a new station is tuned in, the change in the value of the dividing ratio N is detected by detecting circuit 42, whose output triggers timer circuit 43. A certain length of time (for example, four seconds) after the tuning takes place, timer circuit 43 produces an output signal, which is supplied to control circuit 46.

If the new station has been tuned in by manual or automatic tuning, switches $S_0$–$S_7$ will not have been actuated, and therefore address register 36 will have no output. This lack of output is identified by identifying circuit 44, whose output is supplied to control circuit 46. When control circuit 46 receives the output of timing circuit 43, which occurs four seconds after tuning, it senses the above-mentioned output of identifying circuit 44, and changes the positions of switches 47 and 48 to the positions opposite those illustrated. The change in the positions of these switches causes the digital signal corresponding to the dividing ratio N, which is contained in counter 31, to be supplied directly to the second memory 41, whereupon the digital signal is written therein.

Figure 4:
FIGS. 4 and 5 are views similar to that of FIG. 2, but showing codes used in connection with the control circuit of FIG. 3.

If the received broadcast frequency is, for example, 82.5 MHz, the count value N is 718. This value N is memorized in the memory 41 in BCD code as shown in FIG. 4. Since the value N is within the range determined by the condition $653 \leq N \leq 793$, the most significant bit $B_{11}$ of the memory 41 is always "0" when the value N is memorized.

When the above write-in is finished, the switch circuits 47 and 48 are returned to the positions illustrated in FIG. 3. The above operation occurs every time when the manual tuning or auto tuning is carried out.

If, on the other hand, preset tuning has been used to tune in the new station, by actuating one of switches $S_0$–$S_7$, then address register 36 will have an output consisting of the address-identifying signal corresponding to the location in memory 34 that contains the desired frequency data. This output is detected by identifying circuit 44, whose output is supplied to control circuit 46 and second memory 41.

Four seconds, for example, after tuning, control circuit 46 receives the output of timing circuit 43. Control circuit 46 senses the output of identifying circuit 44 and causes second memory 41 to write in the data supplied to it without switches 47 and 48 being moved from the illustrated position. Thus, when second memory 41 is triggered by the output of control circuit 46, it writes in the address-identifying signal that constitutes the output of address register 36.

This address-identifying signal is written into bits $B_0$–$B_3$ of memory 41. At the same time, the output of identifying circuit 44, which in this embodiment is "1" is written into the most significant bit $B_{11}$ of memory 41. Accordingly, if the switch $S_3$, for example, is operated and the broadcast station stored in channel 3 is received, the content of the register 36 is "3" and hence the content of the memory 41 becomes that shown in FIG. 5.

Figure 5:
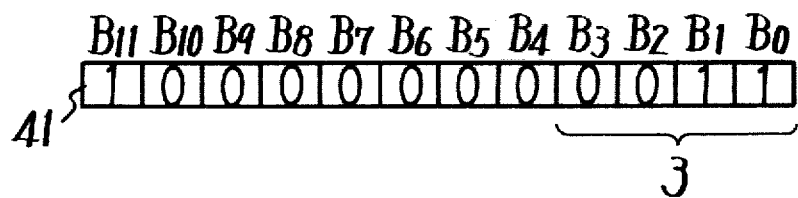

Thus, in the case of manual or auto tuning, the frequency dividing ratio N (whose most significant bit $B_{11}$ is made "0") is stored in the second memory 41, as shown in FIG. 4. On the other hand, in the case of preset tuning, the second memory 41 will contain the address of the chosen station in memory 34 (plus a most significant bit $B_{11}$ of "1"), as shown in FIG. 5.

When the power switch is turned OFF and then ON again, the following operation is performed on the content of the second memory 41. When the power switch is turned ON again, the content at the most significant bit $B_{11}$ of the second memory 41 is identified by the second identifying circuit 45, whose output is fed to the control circuit 46. In the case of $B_{11}$="0", the switch circuits 47 and 48 are changed over to the position opposite to that shown in FIG. 3 and hence the content of the memory 41 (refer to FIG. 4) is fed to the counter 31 through the switch circuit 48 and 47. Thus, the value N of the broadcast frequency, which is received immediately before the power switch is turned OFF, is set in the counter 31 so that the receiver again will receive that broadcast frequency. In this situation, the address register 36 does not address a location in the memory 34, so none of the elements $D_0$ to $D_7$ are lit.

Figure 6:
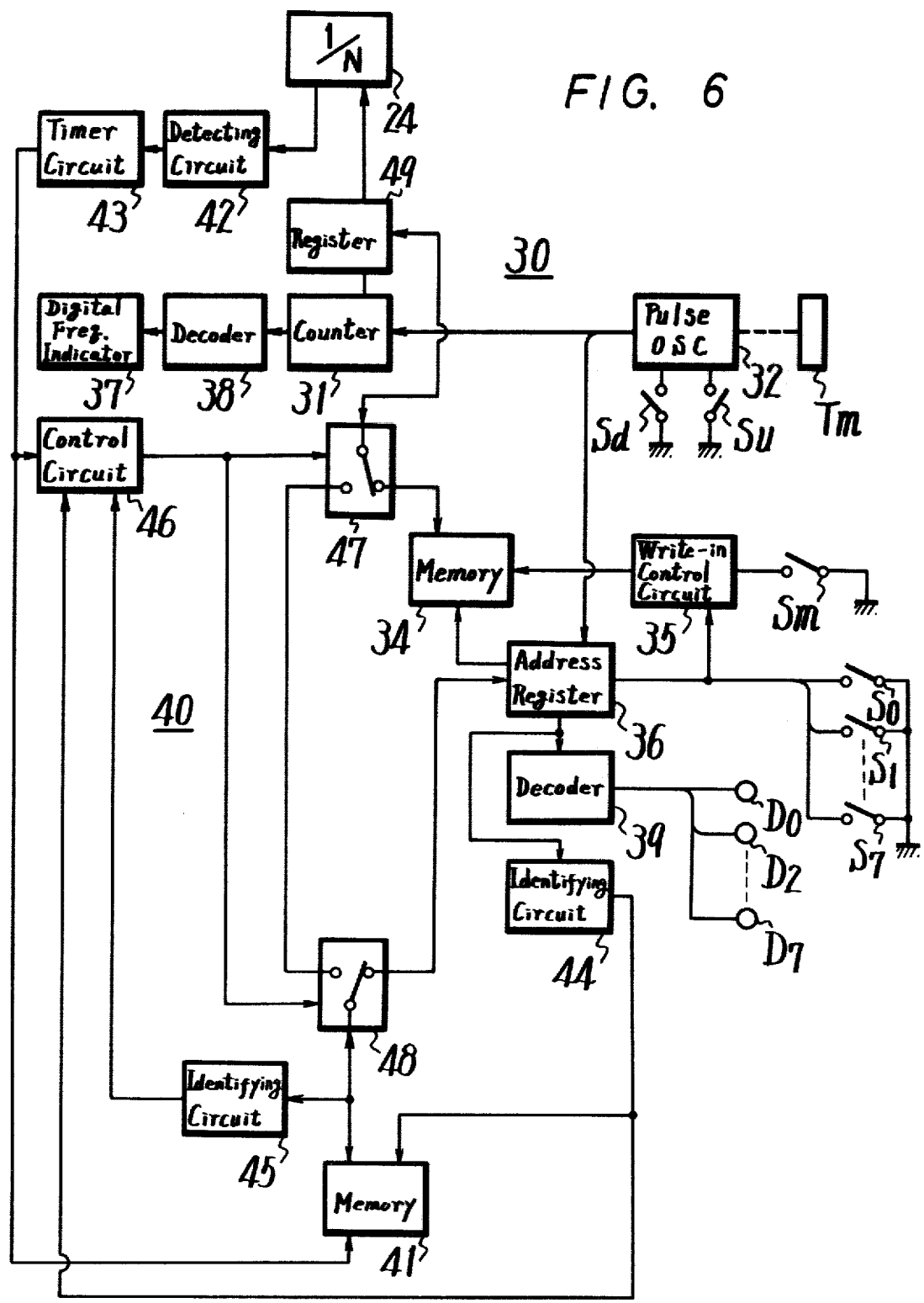
FIG. 6 is a view similar to FIG. 3, but showing a memory control circuit according to another embodiment.

In the embodiment of the invention shown in FIG. 3, the content of the second memory 41 is supplied directly to the counter 31. However, it is possible that, as shown in FIG. 6, the content of the second memory 41 could be supplied to divider 24 through the switch circuit 48 and 47 and a register 49. In this case, the output from the counter 31 is also supplied through the register 49 to the divider 24 and the switch circuit 47. Otherwise, the construction and operation of the example in FIG. 6 are substantially the same as in FIG. 3.

In the case that the most significant bit $B_{11}$ of the memory 41 is "1" when the power switch is turned ON, this bit is identified by the identifying circuit 45 and switch circuits 47 and 48 are changed to (or left in) the position shown in FIGS. 3 and 6. Thus, an address number, contained in bits $B_0$ to $B_3$ (refer to FIG. 5) is transferred to the address register 36, addressing the location in memory 34 containing the frequency data of the broadcast station received when the power switch was turned OFF. Because memory 34 is addressed by the address register 36, one of the elements $D_0$ through $D_7$ corresponding to the address data is lit.

In short, in the case that the most significant bit $B_{11}$ of the memory 41 is "0", the content of the memory 41 is set in the register 31 to receive the last broadcast station; while in the case that the most significant bit $B_{11}$ of the memory 41 is "1", the content of the memory 41 is fed to the address register 36, which addresses the memory 34, to receive the last broadcast station.

As set forth above, according to the present invention, when the power has been turned OFF while receiving a given broadcast station, and when the power switch has then been turned ON again, the same broadcast station can be received in the same tuning mode as before. Accordingly, both timed recording and normal operation are facilitated. Further, a second memory 41 of only 12 bits, which is relatively inexpensive, is sufficient for this purpose.

In the above embodiments of the present invention the value N, which is memorized in the memory 41 in the manual tuning and auto tuning modes, has a format entirely different from that of the output of the address register 36, which is memorized in the memory 41 in the preset tuning mode. It may therefore be possible that, in place of identifying only the bit $B_{11}$, the content of the memory 41 may be identified as a whole. Further, the second memory 41 may be formed of a CPU (central processing unit), ROM (random on memory), or RAM (random access memory).

Further, in the above examples, the frequency data of the broadcast station received immediately before the power switch is turned OFF is memorized in the second memory 41 by means of detecting circuit 42 after the delay caused by timer circuit 43. It is, however, possible that the operating voltage applied to the circuits 10, 20, 30 and 40 may be such that it does not fall immediately after the power switch is turned OFF, so that the frequency data of a broadcast station tuned in immediately before the power switch is turned OFF may still be stored in the second memory 41.

Although illustrative embodiments of this invention have been described in detail herein with reference to the accompanying drawings, it is to be understood that the invention is not limited to those precise embodiments, and that various changes and modifications may be effected therein by one skilled in the art without departing from the spirit and scope of the invention, as defined in the appended claims.

I claim:

1. In an electronic radio frequency tuner having a source of digital signals representing radio frequencies to which the tuner is selectively tuned, and an addressable memory with a plurality of addresses for storing specific ones of said digital signals; a memory control circuit comprising:
    addressing means having an inoperative state and an operative state for selectively providing address-identifying signals which select respective addresses of said memory;
    write-in means for writing a digital signal from said source into the selected address of said memory;
    an additional memory for selectively memorizing either a digital signal from said source or an address-identifying signal from said addressing means; and
    switching means for determining, in response to the state of said addressing means, which of said digital signal and said address-identifying signal is supplied to said additional memory.

2. An electronic radio frequency tuner according to claim 1; in which said address-identifying signal from said addressing means is supplied by said switching means to said additional memory when said addressing means is in said operative state.

3. An electronic radio frequency tuner according to claim 1; in which said digital signals from said source are supplied by said switching means to said additional memory when said addressing means is in its inoperative state.

4. An electronic radio frequency tuner according to claim 1; further comprising first detecting means for detecting the state of said addressing means.

5. An electronic radio frequency tuner according to claim 1; further comprising data register means for storing the one of said digital signals corresponding to the radio frequency to which said tuner is to be tuned.

6. An electronic radio frequency tuner according to claim 5; in which said register means includes a counting device.

7. An electronic radio frequency tuner according to claim 6; in which said electronic radio frequency tuner is a frequency synthesizer tuned by a phase-locked loop which includes a variable-frequency oscillator for producing a local oscillating signal, a programmable frequency divider to divide the frequency of said local oscillating signal by a dividing ratio determined by said counting device, a reference oscillator for producing a reference signal, a phase comparator for comparing the output of said frequency divider with said reference signal to produce an error signal, and means for feeding back said error signal to said variable frequency oscillator to control the frequency of said local oscillating signal.

8. An electronic radio frequency tuner according to claim 5; further comprising detecting means for detecting whether the content of said additional memory is a digital signal or an address-identifying signal;
    and wherein said switching means is responsive to said detecting means for supplying said content of said additional memory to said addressing means and to said data register means in response to said content being an address-identifying signal and a digital signal, respectively.

9. An electronic radio frequency tuner according to claim 8; in which said switching means further supplies a digital signal from said addressable memory to said data register means in response to said content of the additional memory being an address-identifying signal.

10. An electronic radio frequency tuner according to claim 1; in which said additional memory includes a non-volatile memory device.

11. An electronic radio frequency tuner according to claim 1; further comprising decoder means for determining the address in said addressable memory represented by said address-identifying signal from said addressing means when the latter is in said operative state, and display means for indicating said address.

* * * * *